United States Patent
Jin et al.

(10) Patent No.: US 9,470,722 B2
(45) Date of Patent: Oct. 18, 2016

(54) METHOD FOR MEASURING ELECTRIC POTENTIAL DIFFERENCE

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 643 days.

(21) Appl. No.: 13/932,966

(22) Filed: Jul. 1, 2013

(65) Prior Publication Data

US 2014/0184250 A1 Jul. 3, 2014

(30) Foreign Application Priority Data

Dec. 28, 2012 (CN) .......................... 2012 1 05821316

(51) Int. Cl.
| | |
|---|---|
| *G01R 27/14* | (2006.01) |
| *G01R 19/10* | (2006.01) |
| *B82Y 30/00* | (2011.01) |
| *G01R 29/14* | (2006.01) |

(52) U.S. Cl.
CPC .............. *G01R 19/10* (2013.01); *B82Y 30/00* (2013.01); *G01R 29/14* (2013.01)

(58) Field of Classification Search
CPC ....... G01R 19/10; G01R 29/14; B82Y 30/00
See application file for complete search history.

(56) References Cited

U.S. PATENT DOCUMENTS

| 8,459,866 B2 | 6/2013 | Li et al. | |
|---|---|---|---|
| 2003/0129436 A1* | 7/2003 | Ramm | B01J 35/002 428/519 |
| 2009/0153513 A1 | 6/2009 | Liu et al. | |
| 2011/0031218 A1 | 2/2011 | Liu et al. | |
| 2012/0115245 A1* | 5/2012 | Hasegawa | G01N 21/658 436/501 |
| 2013/0105824 A1* | 5/2013 | Paranjape | H01L 31/032 257/86 |

FOREIGN PATENT DOCUMENTS

| CN | 101654219 | 2/2010 |
|---|---|---|
| TW | 200734272 | 9/2007 |
| TW | 201042251 | 12/2010 |

\* cited by examiner

*Primary Examiner* — Huy Q Phan
*Assistant Examiner* — Adam Clarke
(74) *Attorney, Agent, or Firm* — Zhigang Ma

(57) ABSTRACT

A method for measuring electric potential difference comprises following steps. A carbon nanotube composite layer is located on an object and electrically connected to a first region and a second region spaced from each other in the object, wherein an unknown electric potential difference U exists between the first region and the second region. Characteristic band frequency value Y* of Raman-spectra of the carbon nanotube composite layer under the unknown electric potential difference U is measured. A relationship between the characteristic band frequency value Y of Raman-spectra and the electric potential difference $\Delta U$ of the carbon nanotube composite layer is obtained. Value of unknown electric potential difference U is obtained through the relationship between the characteristic band frequency value Y of Raman-spectra and the electric potential difference $\Delta U$.

19 Claims, 17 Drawing Sheets

(S10), providing an object 110 having a first region 101 and a second region 102 spaced from each other, wherein an unknown electric potential difference U exists between the first region 101 and the second region 102

(S20), locating a carbon nanotube composite layer 100 on the object 110 and electrically connecting two opposite ends of the carbon nanotube composite layer 100 to the first region 101 and the second region 102

(S30), measuring a characteristic band frequency value Y* of Raman-spectra of the carbon nanotube composite layer 100 under the unknown electric potential difference U (S40), obtaining a relationship between a characteristic band frequency value Y of Raman-spectra and the electric potential difference$\Delta$U between the first region 101 and the second region 102

(S50), obtaining value of unknown electric potential difference U from the relationship

FIG. 1

METHOD FOR MEASURING ELECTRIC POTENTIAL DIFFERENCE

This application claims all benefits accruing under 35 U.S.C. §119 from China Patent Application No. 201210582131.6 filed on Dec. 28, 2012 in the China Intellectual Property Office.

BACKGROUND

1. Technical Field

The present disclosure relates to a method for measuring electric potential difference.

2. Discussion of Related Art

Electric potential difference is an important parameter which reflects the electrical properties of an electrical device. The measurement of the electric potential difference of a variety of electrical devices is particularly important.

When the electrical device or a distance needed to be measured between two regions is micro-scaled, such as smaller than 20 micrometers, it is more difficult to measure the electric potential difference between the two regions. One reason is, that measuring instruments in the traditional method are large compared to the distance between two regions to be measured.

What is needed, therefore, is to provide a method for measuring the electric potential difference in the micro-scaled electrical devices or distance.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

FIG. 1 shows a flowchart of one embodiment of a method for measuring electric potential difference.

DETAILED DESCRIPTION

Figure 2:
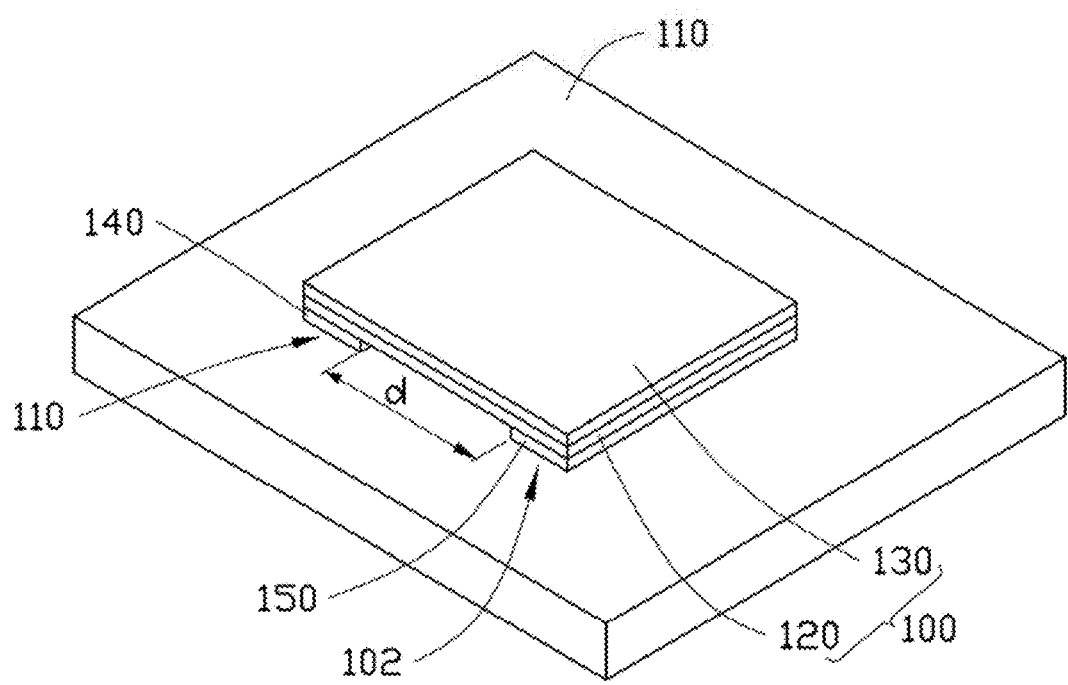
FIG. 2 is a structural schematic view of an embodiment of an electric potential difference measurement apparatus.
Figure 3:
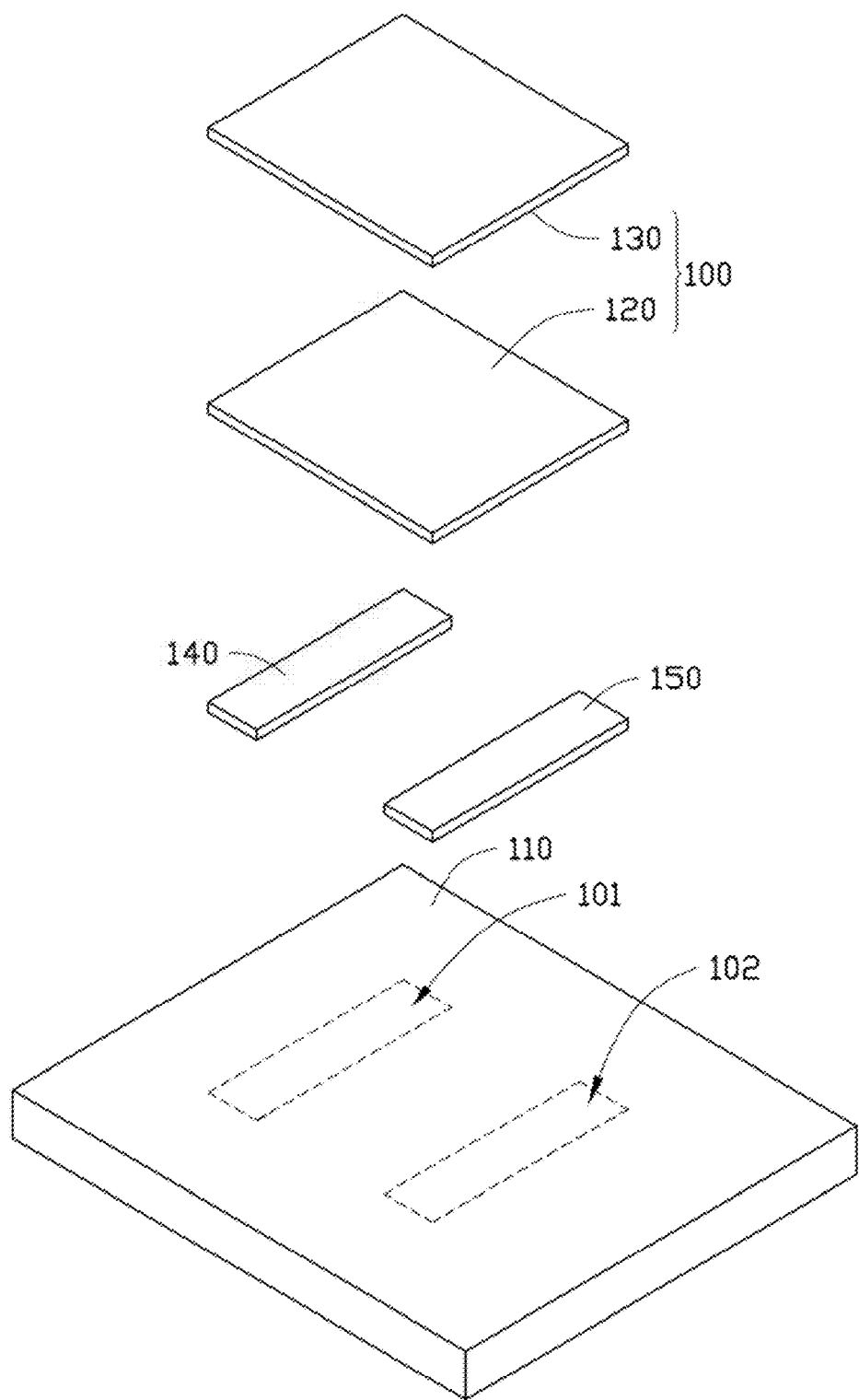
FIG. 3 shows an exploded view of the measurement apparatus of FIG. 2.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIG. 1, one embodiment of a method for measuring electric potential difference includes following steps:

(S10), providing an object 110 having a first region 101 and a second region 102 spaced from each other, wherein an unknown electric potential difference U exists between the first region 101 and the second region 102;

(S20), locating a carbon nanotube composite layer 100 on the object 110 and electrically connecting two opposite ends of the carbon nanotube composite layer 100 to the first region 101 and the second region 102;

(S30), measuring a characteristic band frequency value Y* of Raman-spectra of the carbon nanotube composite layer 100 under the unknown electric potential difference U;

(S40), obtaining a relationship between a characteristic band frequency value Y of Raman-spectra and the electric potential difference ΔU between the first region 101 and the second region 102; and (S50), obtaining value of unknown electric potential difference U from the relationship.

In step (S10), the shape of the object 110 can be circular, rectangular, triangular, or other geometric. A distance d between the first region 101 and the second region ranges from about 1 micrometer to about 10 centimeters. In one embodiment, the distance d ranges from about 1 micrometer to about 20 micrometers.

In step (S20), the carbon nanotube composite layer 100 is electrically connected to the first region 101 and the second region 102. In one embodiment, the carbon nanotube composite layer 100 includes a first end and a second end opposite to the first end. The first end is electrically connected to the first region 101, and the second end is electrically connected to the second region 102.

A portion of the carbon nanotube composite layer 100 between the first region 101 and the second region 102 is spaced from the object 110. The first end can be electrically connected to the first region 101 via a first electrode 140 sandwiched between the object 110 and the carbon nanotube composite layer 100. The second end can be electrically connected to the second region 102 via a second electrode 150 sandwiched between the object 110 and the carbon nanotube composite layer 100. The first electrode 140 is located in the first region 101, and the second electrode 150 is located in the second region 102. The first electrode 140 and the second electrode 150 can totally cover the first region 101 and the second region 102 respectively.

The first electrode 140 and the second electrode 150 can be bar-shape, rod-shaped, or other geometric. The material of the first electrode 140 and the second electrode 150 can be metal, conductive polymer, conductive glue, metallic carbon nanotube, or Indium tin oxide (ITO). The first electrode 140 and the second electrode 150 can be formed on first region 101 and the second region 102 respectively via chemical vapor deposition method, physical vapor deposition method, vacuum vapor deposition method, magnetron sputtering method or coating method. In one embodiment, the first electrode 140 and the second electrode 150 are bar-shaped, and coated on the object 110 via conductive glue.

It is can be understood that, the carbon nanotube composite layer 100 can be located on the object 110, and the first end and the second end of the carbon nanotube composite layer 100 can be directly located on the first region 101 and the second region 102 respectively. The first region 101 and the second region 102 is smooth, and the carbon nanotube composite layer 100 can be tightly attached on the first region 101 and the second region 102. A part of the carbon nanotube composite layer 100 between the first region 101 and the second region 102 is spaced from the object by an insulating layer (not shown). Thus the first electrode 140 and the second electrode 150 can be omitted.

The portion of the carbon nanotube composite layer 100 between the first region 101 and the second region 102 can be spaced from the object 110 via an insulating layer (not shown) sandwiched between them. In one embodiment, the carbon nanotube composite layer 100 is suspended above the object 110 through the first electrode 140 and the second electrode 150. That is, the portion of the carbon nanotube composite layer 100 between the first electrode 140 and the second electrode 150 is suspended. The carbon nanotube composite layer 100 comprises a plurality of carbon nanotubes uniformly dispersed in the carbon nanotube composite layer, and the plurality of carbon nanotubes forms a conductive network, thus the electric current is uniformly dispersed in the carbon nanotube composite layer 100.

The carbon nanotube composite layer 100 includes a carbon nanotube layer 120 and a metal layer 130, located on the carbon nanotube layer 120. The metal layer 130 includes a plurality of metal particles and can be a continuously layered-structure. The carbon nanotube layer 120 includes a plurality of carbon nanotubes. In one embodiment, the carbon nanotube layer 120 consists of the plurality of carbon nanotubes. The carbon nanotube layer 120 includes a first surface adjacent to the object 110, and a second surface opposite to the first surface. The metal layer 130 consists of the plurality of metal particles and is located on the second surface of the carbon nanotube layer 120. At least part of the plurality of carbon nanotubes are coated with the metal layer 130.

The carbon nanotube layer 120 is a continuously layered-structure. A thickness of the carbon nanotube layer 120 ranges from about 0.5 nanometers to about 1 millimeter. The carbon nanotube layer 120 is a freestanding structure. The term "freestanding structure" means that the carbon nanotube layer 120 can sustain the weight of itself when it is hoisted by a portion thereof without any significant damage to its structural integrity. Thus, the carbon nanotube layer 120 can be suspended by two spaced supports. The carbon nanotube layer 120 includes a plurality of carbon nanotubes parallel with the surface of the carbon nanotube layer 120. The carbon nanotubes in the carbon nanotube layer 120 can be single-walled, double-walled, or multi-walled carbon nanotubes. In one embodiment, the carbon nanotube layer 120 can be a substantially pure structure of carbon nanotubes. The plurality of carbon nanotubes are joined by van der Waals force. The length and diameter of the carbon nanotubes can be selected according to need.

The carbon nanotube layer 120 can include at least one carbon nanotube film, at least one carbon nanotube wire, or combination thereof. In one embodiment, the carbon nanotube layer 120 can include a single carbon nanotube film or two or more stacked carbon nanotube films. The carbon nanotube film can be a drawn carbon nanotube film, a flocculate carbon nanotube film, or a pressed carbon nanotube film. In another embodiment, the carbon nanotube layer 120 can include a plurality of untwisted carbon nanotube wires or a plurality of twisted wires.

Figure 4:
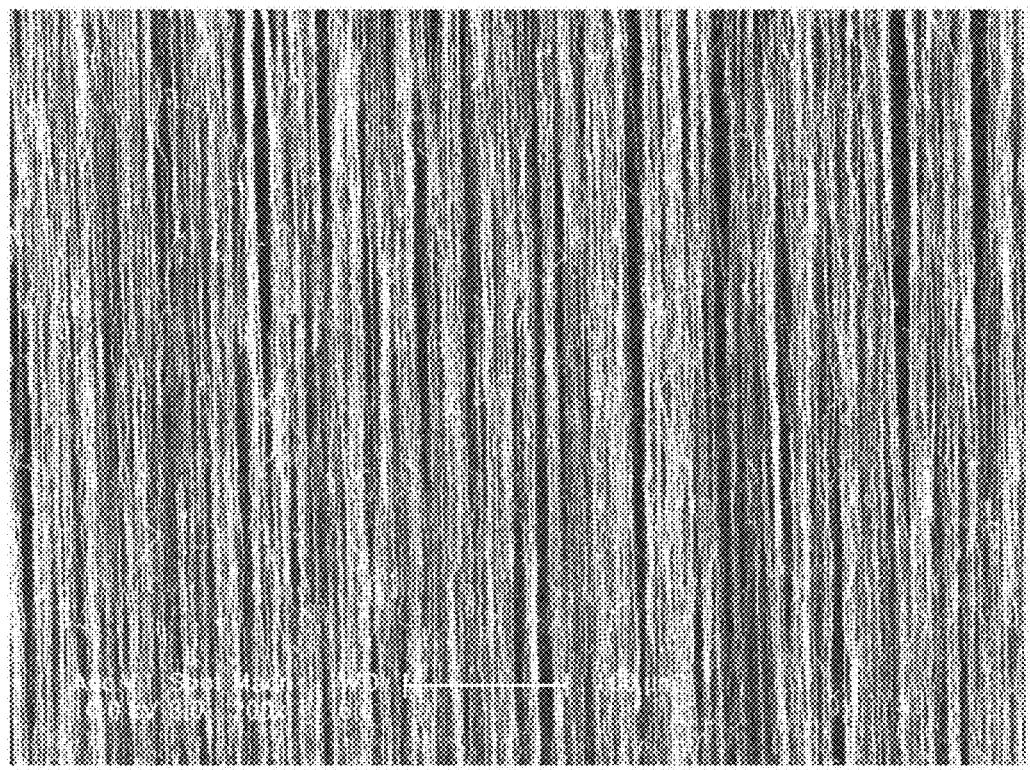
FIG. 4 shows a scanning electron microscope (SEM) image of a drawn carbon nanotube film.

Referring to FIG. 4, the drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a freestanding film. The drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. Some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nm to about 100 μm. While the drawn carbon nanotube film located on the object 110, the plurality of carbon nanotubes can be parallel with the surface of the object 110.

The carbon nanotube layer 120 can include at least two stacked drawn carbon nanotube films. In other embodiments, the carbon nanotube layer 120 can include two or more coplanar drawn carbon nanotube films, and can include layers of coplanar drawn carbon nanotube films. Additionally, when the carbon nanotubes in the drawn carbon nanotube film are aligned along one preferred orientation (e.g., the drawn carbon nanotube film), an angle can exist between the orientation of carbon nanotubes in adjacent films, whether stacked or adjacent. Adjacent drawn carbon nanotube films can be combined by only the van der Waals attractive force therebetween. An angle between the aligned directions of the carbon nanotubes in two adjacent drawn carbon nanotube films can range from about 0 degrees to about 90 degrees. When the angle between the aligned directions of the carbon nanotubes in adjacent stacked drawn carbon nanotube films is larger than 0 degrees. In one embodiment, the carbon nanotube layer 120 is shown with the angle between the aligned directions of the carbon nanotubes in adjacent stacked drawn carbon nanotube films is 90 degrees. Stacking the drawn carbon nanotube films will also add to the structural integrity of the carbon nanotube layer 120.

Figure 5:
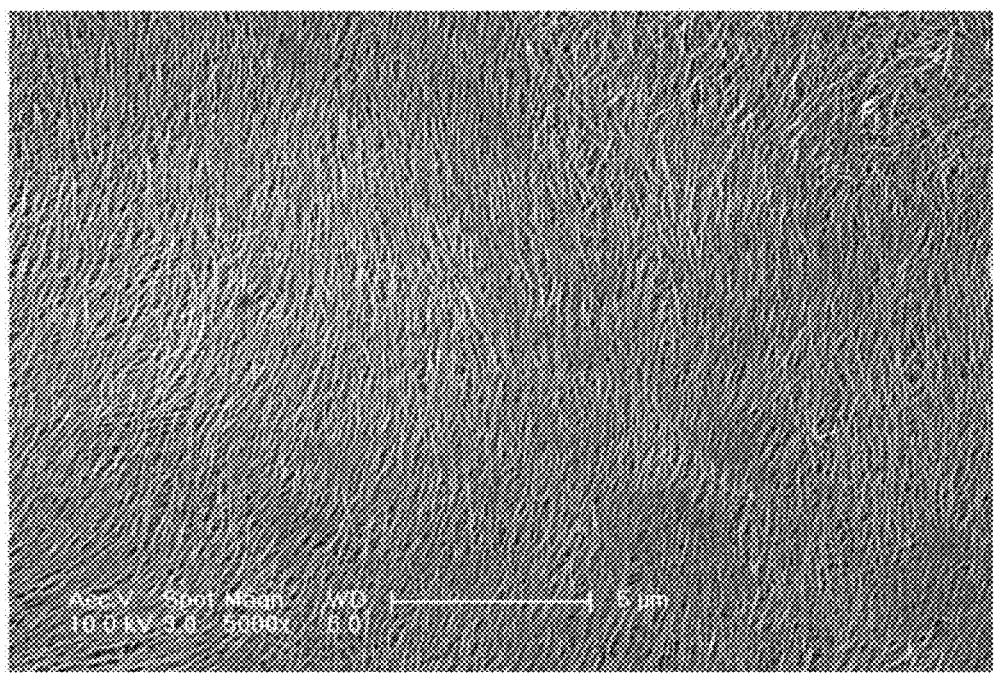
FIG. 5 shows a SEM image of a pressed carbon nanotube film including isotropic carbon nanotubes.
Figure 6:
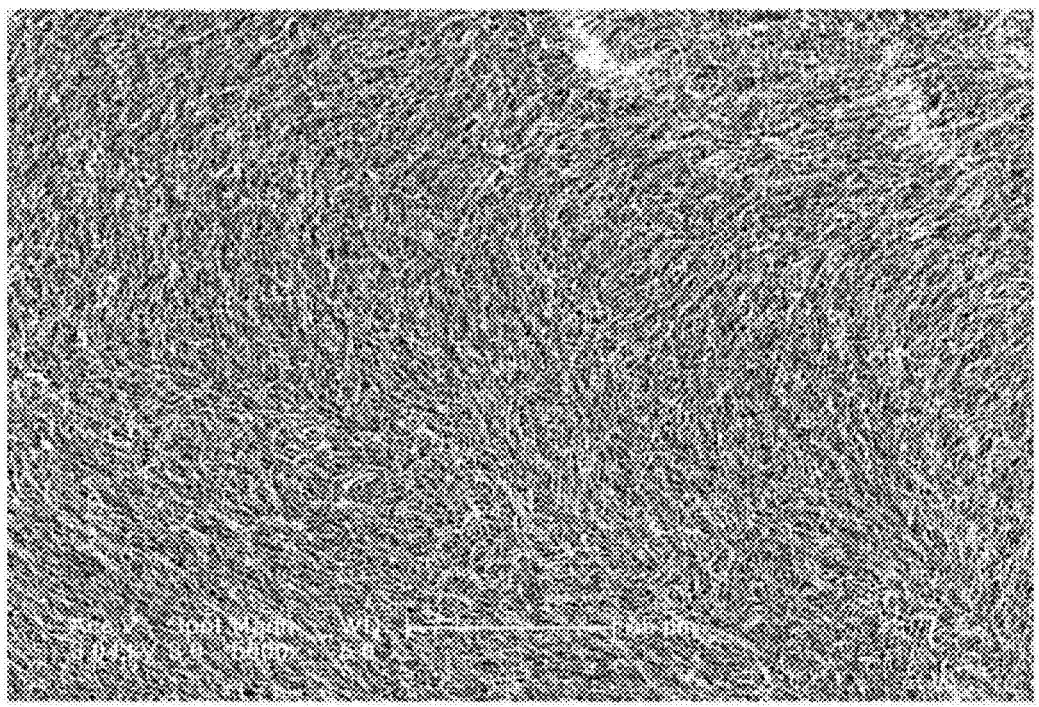
FIG. 6 shows a SEM image of a pressed carbon nanotube film including a plurality of carbon nanotubes having a preferred orientation.

Referring to FIGS. 5-6, the pressed carbon nanotube film can include a plurality of carbon nanotubes. The plurality of carbon nanotubes in the carbon nanotube film can be overlapped with each other. The adjacent carbon nanotubes are combined and attracted by van der Waals attractive force, thereby forming a free-standing structure. The carbon nanotube film can be formed by pressing a carbon nanotube array. An angle between a primary alignment direction of the carbon nanotubes and a base of the pressed carbon nanotube film such that the angle is in an approximate range from 0° to approximately 15°. The angle is closely related to pressure applied to the carbon nanotube array. The greater the pressure, the smaller the angle. The plurality of carbon nanotubes in the pressed carbon nanotube film can parallel to the surface of the pressed carbon nanotube film. A length and a width of the pressed carbon nanotube film can be arbitrarily set as desired. The plurality of carbon nanotubes in the pressed carbon nanotube film are arranged isotropically, arranged along a same direction or arranged along different directions according to the pressed direction. Referring to FIG. 5, the plurality of carbon nanotubes are overlapped with each other and substantially oriented along the same direction. Referring to FIG. 6, the plurality of carbon nanotubes are overlapped with each other and oriented along different directions.

Figure 7:
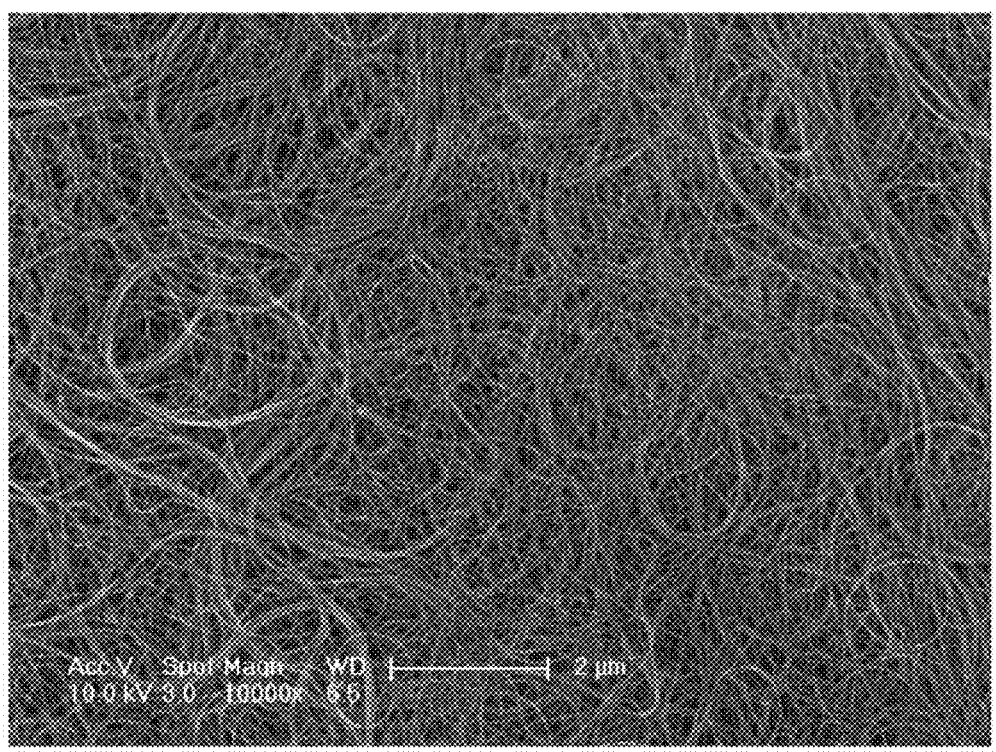
FIG. 7 shows a SEM image of a floccule carbon nanotube film.

Referring to FIG. 7, the floccule carbon nanotube film can include a plurality of carbon nanotubes entangled with each other to form a carbon nanotube floccule structure. A length of the carbon nanotubes is above about 10 microns. The adjacent carbon nanotubes are combined and entangled by van der Waals attractive force therebetween, thereby forming an entangled structure/microporous structure. Further, the carbon nanotube film is isotropic. It is understood that the carbon nanotube film is very microporous. Sizes of the micropores are less than about 10 micrometers. Length and width of the carbon nanotube film are not limited. In the present embodiment, the carbon nanotube film includes a plurality of long, curved, disordered carbon nanotubes entangled with each other.

The carbon nanotube film can be directly attached on the first region 101 and the second region 102, or the first electrode 140 and the second electrode 150. Furthermore, the carbon nanotube film can be treated with an organic solvent after being placed on the object 110. Specifically, the organic solvent can be dipped onto the carbon nanotube layer which is located in the first region 101 and the second region 102. The organic solvent can be volatile, such as ethanol, methanol, acetone, dichloromethane, chloroform, or mixtures thereof. In one embodiment, the organic solvent is ethanol.

Figure 8:
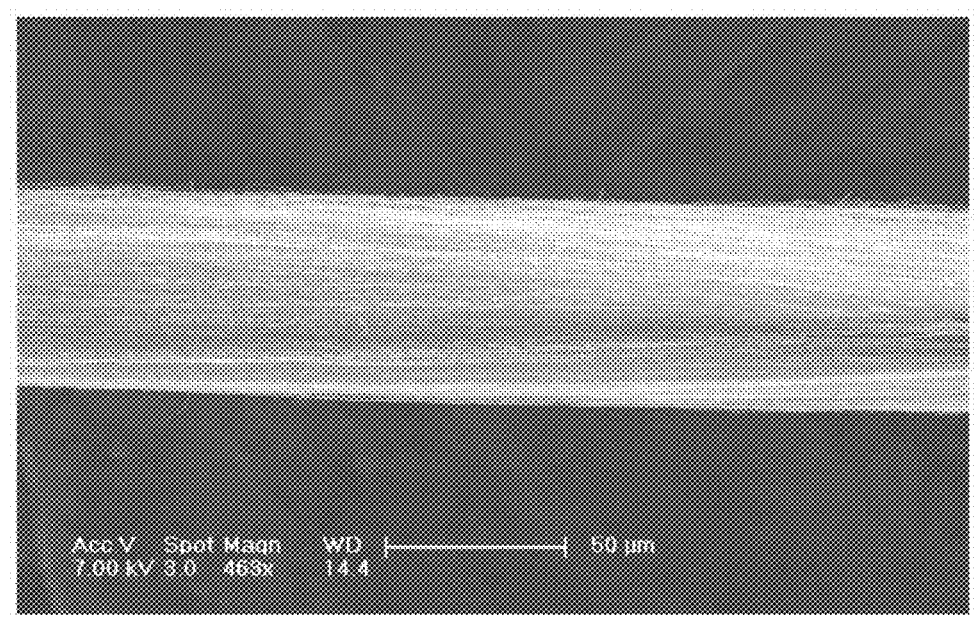
FIG. 8 shows a SEM image of an untwisted carbon nanotube wire.
Figure 9:
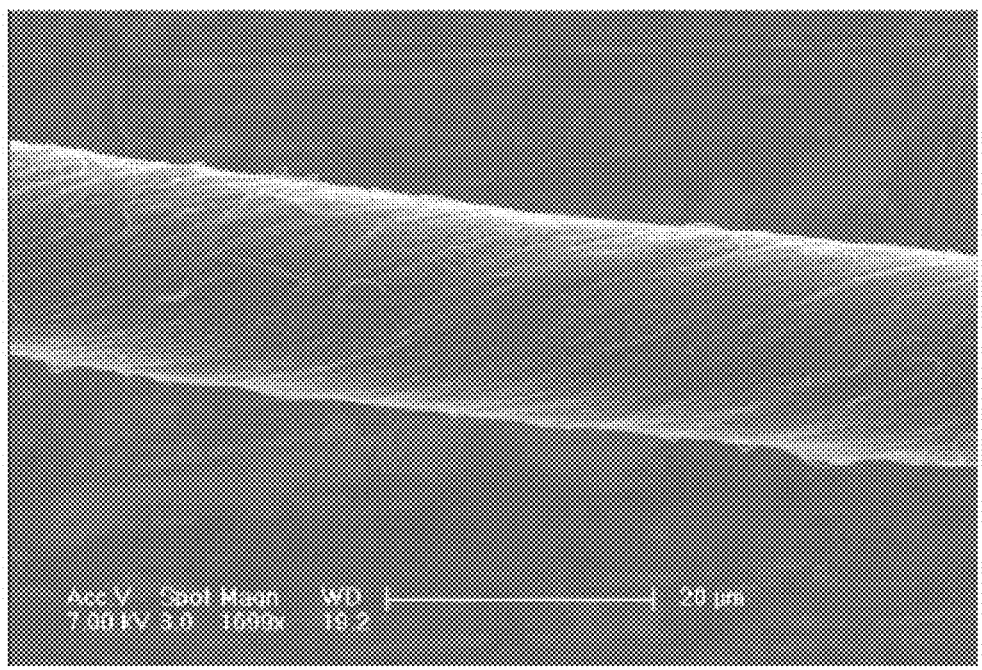
FIG. 9 shows a SEM image of a twisted carbon nanotube wire.

Referring to FIGS. 8-9, the carbon nanotube layer 120 can also include a plurality of carbon nanotube wires intersected with each other to form a layered-structure. The carbon nanotube wire includes a plurality of carbon nanotubes aligned along an axial direction of the carbon nanotube wire. The plurality of carbon nanotube wire intersects with each other to form a conductive web. Referring to FIG. 8, the carbon nanotube wire can be untwisted. The untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity and shape. Length of the untwisted carbon nanotube wire can be arbitrarily set as desired. A diameter of the untwisted carbon nanotube wire ranges from about 0.5 nm to about 100 μm. Referring to FIG. 9, the twisted carbon nanotube wire can be formed by twisting a drawn carbon nanotube film using a mechanical force to turn the two ends of the drawn carbon nanotube film in opposite directions. The twisted carbon nanotube wire includes a plurality of carbon nanotubes helically oriented around the axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizing. The specific surface area of the twisted carbon nanotube wire will decrease, while the density and strength of the twisted carbon nanotube wire will be increased.

The metal layer 130 includes a plurality of metallic particles located on the surface of the carbon nanotube layer 120 away from the object 110. The metal layer 130 shields the carbon nanotube layer 120 from being irradiated by the laser. A material of the metal layer 130 can be nickel, iron, chromium or other metals. In one embodiment, material of the metal layer 130 is nickel. A thickness of the metal layer 130 ranges from about 5 nanometers to about 50 nanometers, such as 10 nanometers, 20 nanometers. The metal layer 130 can be deposited on the carbon nanotube layer 120 via chemical vapor deposition method, physical vapor deposition method, vacuum deposition method or magnetron sputtering method.

In the step (S30), the characteristic band frequency value of Raman-spectra of the carbon nanotube composite layer 100 can be obtained via a Raman spectrometer. A Raman-laser emitted by the Raman spectrometer is focused on the carbon nanotube composite layer 100. In detail, the Raman-laser is focused on the metal layer 130 of the carbon nanotube composite layer 100. The Raman-spectra of the carbon nanotube composite layer 100 includes a plurality of peaks. The higher peaks such as peak G, peak D, and the peak 2D can be configured as the characteristic band frequency value of Raman-spectra of the carbon nanotube composite layer 100. The peak G is the highest peak in the Raman-spectra of the carbon nanotube composite layer 100. In one embodiment, the peak G is configured as the characteristic band frequency value of Raman-spectra of the carbon nanotube composite layer 100.

While an electric potential difference exists between the first region 101 and the second region 102, an electric current will flows in the carbon nanotube composite layer 100. Thus temperature of the carbon nanotube composite layer 100 will be raised into a determined temperature, and the characteristic band frequency value of Raman-spectra of the carbon nanotube composite layer 100 will be accordingly changed. Furthermore, the characteristic band frequency value of Raman-spectra of the carbon nanotube composite layer 100 varies linearly with its temperature. Therefore, the characteristic band frequency value of Raman-spectra varies linear with the electric potential difference between the first region 101 and the second region 102. Thus the electric potential difference between the first region 101 and the second region 102 can be calculated out by measuring the characteristic band frequency value of Raman-spectra.

The Raman-laser is focused on the portion of the carbon nanotube composite layer 100 suspended between the first region 101 and the second region 102. Since the resolution ability of the Raman-laser can reach to 1 micrometer so that each point of suspended part of the carbon nanotube composite layer 100 having a length less than 20 micrometers can be accurately measured. Furthermore, the Raman-laser can be focused on different points of the carbon nanotube composite layer 100 to get a plurality of characteristics band frequency value of the carbon nanotube layer 120. Thus the characteristic band frequency value of the carbon nanotube composite layer 100 can be defined as the average value of the plurality of characteristic band frequency value. In one embodiment, three different points of the carbon nanotube composite layer can be focused on.

Figure 10:
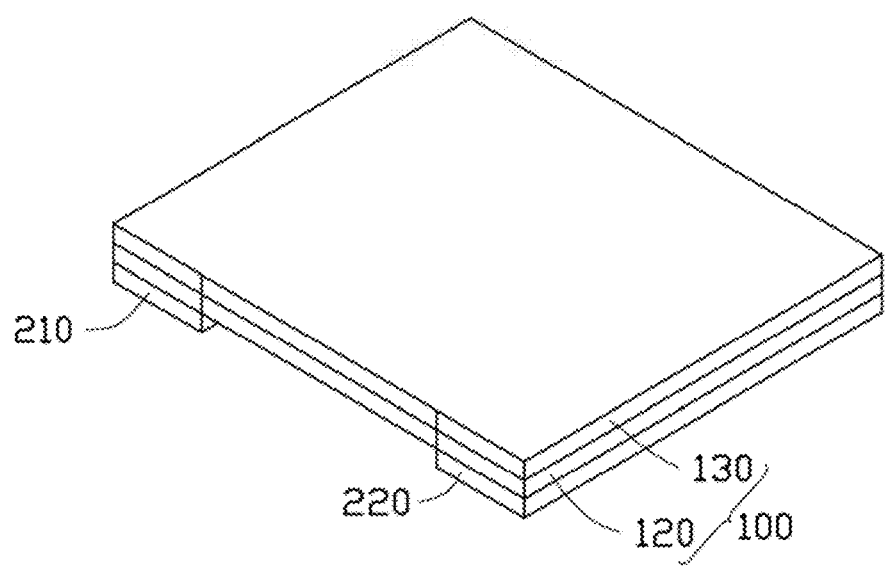
FIG. 10 shows a curve representing a relationship between characteristic band frequency value Y of Raman-spectra and the electric potential difference ΔU of the carbon nanotube composite layer.
Figure 11A:
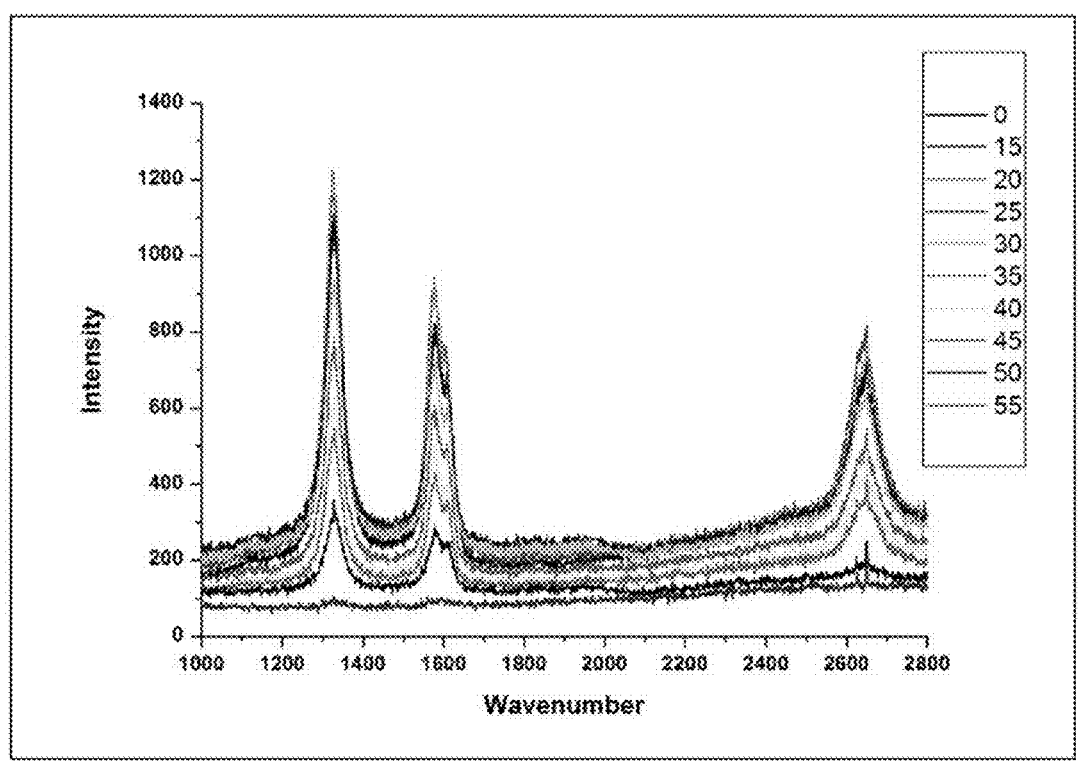
FIGS. 11A-11D shows a Raman spectrum of the carbon nanotube composite layer under different voltage applied on the carbon nanotube composite layer.
Figure 11B:
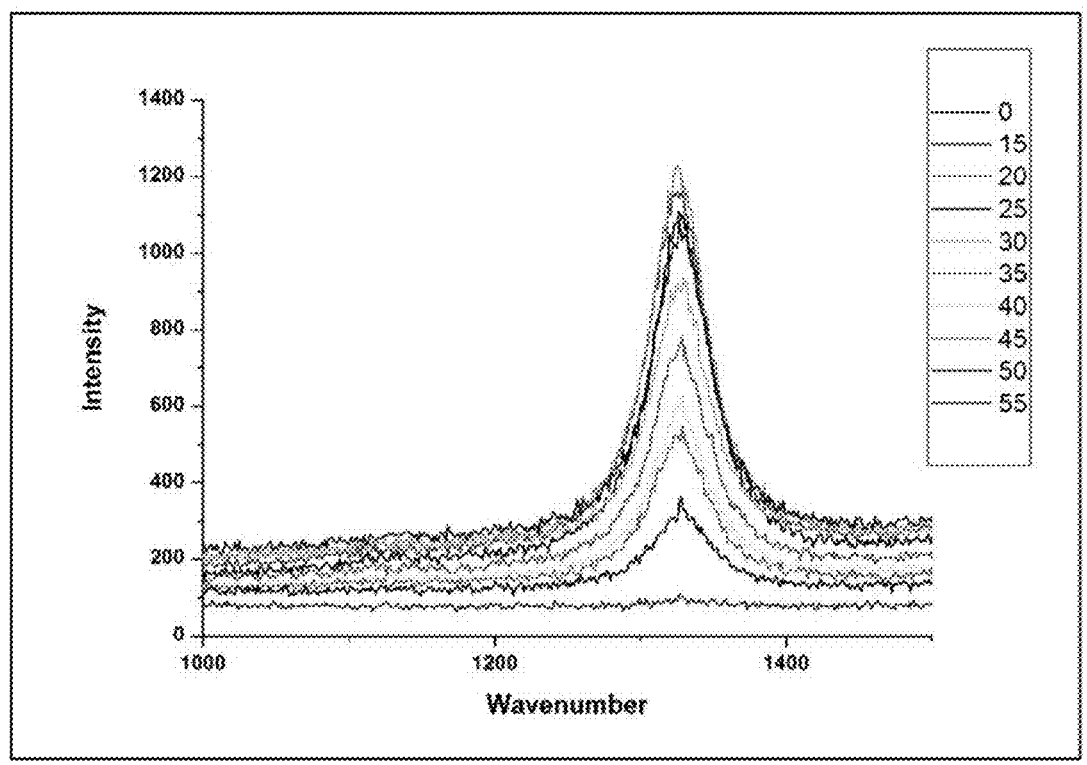
Figure 11C:
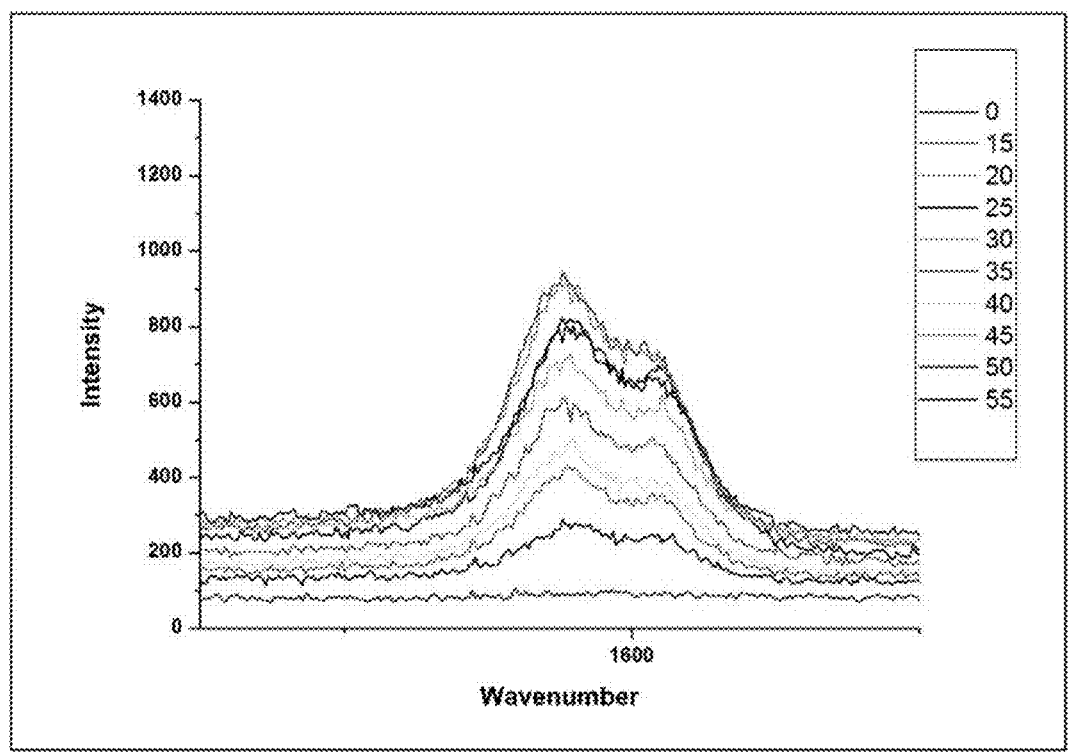
Figure 11D:
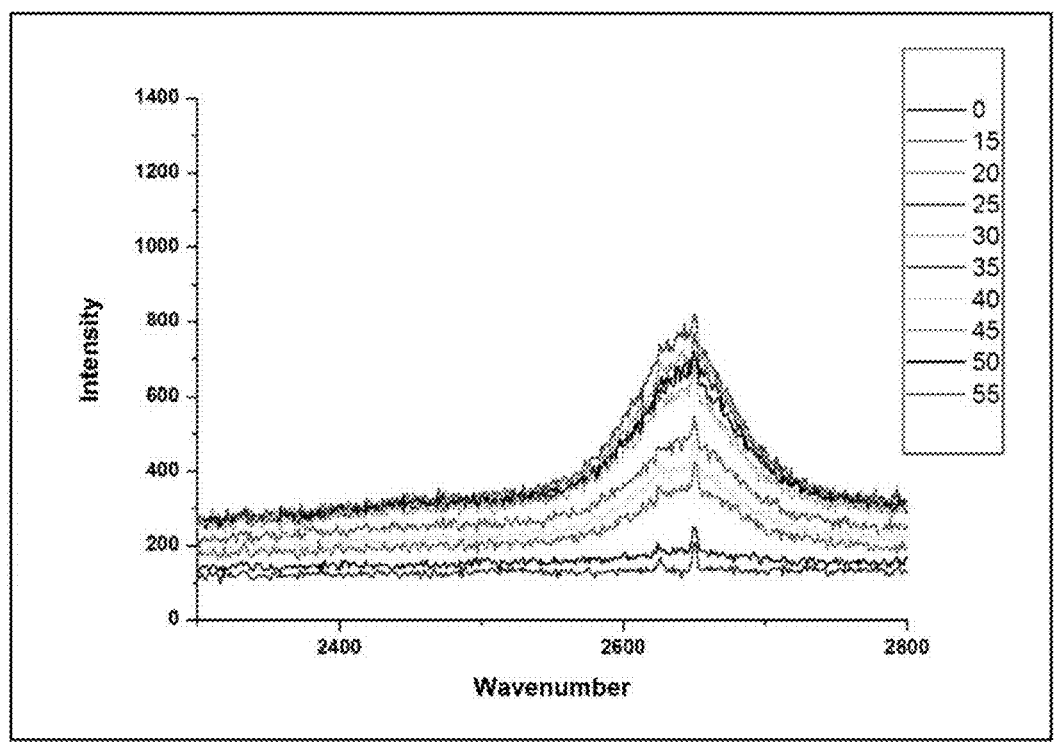

Referring to FIG. 10, in the step (S40), the relationship between the characteristic band frequency value Y of Raman-spectra and the electric potential difference $\Delta U$ of the carbon nanotube composite layer 100 can be obtained by following steps:

(S401), providing a carbon nanotube composite layer 200 which is same as the carbon nanotube composite layer 100;

(S402), locating a third electrode 210 and a fourth electrode 220 electrically connected to the carbon nanotube composite layer 200, wherein the third electrode 210 and the fourth electrode 220 are spaced from each other;

(S403), obtaining a plurality of characteristic band frequency value Y' of Raman-spectra of the carbon nanotube composite layer 200 by applying a plurality of predetermined voltage $\Delta U'$ between the third electrode 210 and the fourth electrode 220; and (S404), obtaining the relationship as $Y=a\cdot \Delta U+b$ by fitting the plurality of characteristic band frequency value Y' and the plurality of predetermined voltage $\Delta U'$ to a curve, wherein a and b are constant value respectively.

In step (S401), the carbon nanotube composite layer 200 is same as the carbon nanotube composite layer 100, means that the characteristic of the carbon nanotube composite layer 200 is same as the carbon nanotube composite layer 100, such as the characteristic band frequency value of Raman-spectra. The carbon nanotube composite layer 200 and the carbon nanotube layer 120 can be divided from one carbon nanotube composite layer. Because the carbon nanotube composite layer 100 is attached on the object 120 and applied with the determined electric potential difference, thus it is not convenient directly obtain the relationship between the characteristic band frequency value Y of Raman-spectra and various electric potential difference $\Delta U$. However, because the characteristic of the carbon nanotube composite layer 200 is same as the carbon nanotube composite layer 100, thus the relationship between the characteristic band frequency value of Raman-spectra and various electric potential difference of carbon nanotube composite layer 100 can be defined as the relationship of the carbon nanotube composite layer 200.

In step (S402), the third electrode 210 and the fourth electrode 220 are spaced from each other. A distance between the third electrode 210 and the fourth electrode 220 is greater than 1 micrometer. In one embodiment, the distance between the third electrode 210 and the fourth electrode 220 ranges from about 10 micrometers to about 10 centimeters. In one embodiment, the distance is about 3 centimeters.

In the step (S403), the third electrode 210 and the fourth electrode 220 are electrically connected to a power supply device (not shown). The power supply device supplies the plurality of predetermined voltage between the third electrode 210 and the fourth electrode 220. Referring to FIGS. 11A-11D, the plurality of characteristic band frequency value Y of Raman-spectra under the plurality of predetermined voltage can be measured by the Raman-spectrometer.

Figure 12:
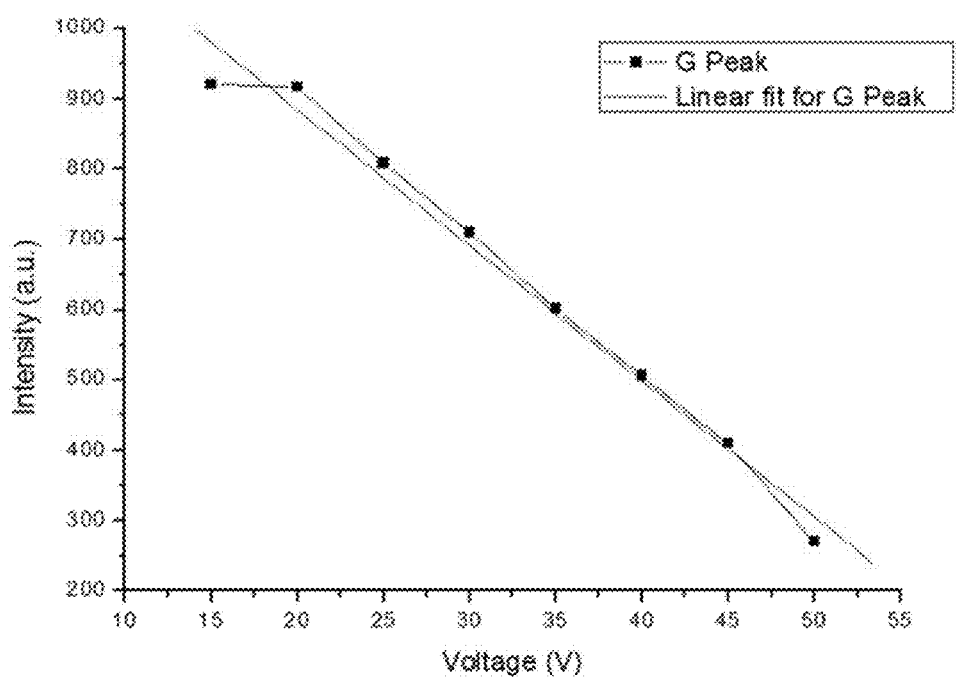
FIG. 12 shows a curve representing a relationship between the characteristic G band frequency value of Raman-spectra and the voltage applied on the carbon nanotube composite layer.

In step (S404), the method for fitting the plurality of characteristic band frequency value Y' and the plurality of predetermined voltage $\Delta U'$ can be with the use of linear regression, non-linear regression, or with a spline function. In one embodiment, the plurality of characteristic band frequency value Y' and the plurality of predetermined voltage $\Delta U'$ is fit by linear regression and a straight line is obtained as shown in FIG. 12. The straight line represents the characteristic band frequency value Y dependence of the predetermined voltage $\Delta U$, and the straight line is represented as a formula $Y=a\cdot \Delta U+b$, and a, b are constants. In one embodiment, the relationship between the characteristic band frequency value Y and the predetermined voltage $\Delta U$ is shown as $Y=1271.2-19.3\times \Delta U$.

In step (S50), the unknown electric potential difference U between the first region 101 and the second region 102 can be obtained through the relationship $Y=a\cdot \Delta U+b$. From the relationship $Y=a\cdot \Delta U+b$, the electric potential difference $\Delta U$ can be deduced as $\Delta U=(Y-b)/a$. Therefore, for the characteristic band frequency value Y*, the unknown electric potential difference U between the first region 101 and the second region 102 can be calculated by $U=(Y*-b)/a$.

Furthermore, the carbon nanotube composite layer 100 can be easily removed from the object 110. The carbon nanotube composite layer 100 can be removed by washing with water, laser etching, or peeled off with a pliers without damaging the object 110. The method is suitable for measuring the electric potential difference under micro-sized distance.

Figure 13:
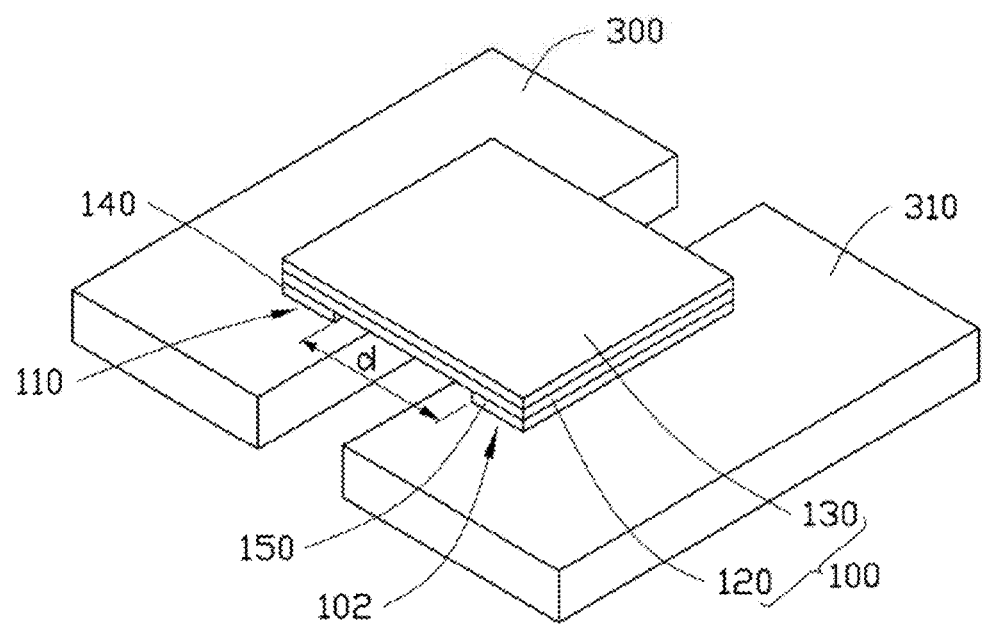
FIG. 13 shows a structural schematic view of another embodiment of an electric potential difference measurement apparatus.
Figure 14:
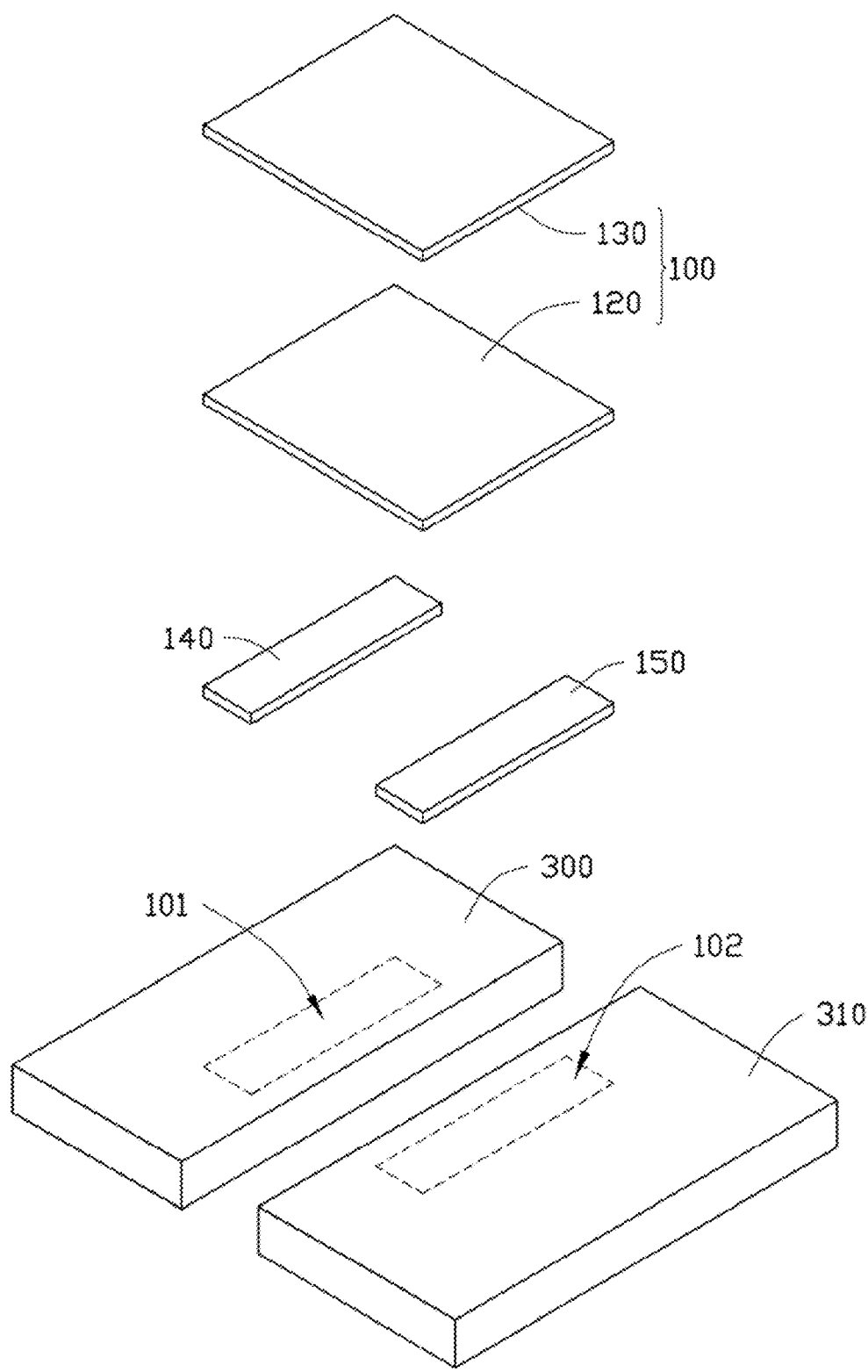
FIG. 14 shows an exploded view of the measurement apparatus of FIG. 13.

Referring to FIGS. 13-14, another embodiment of a method for measuring electric potential difference between two spaced objects includes following steps:

(S10), providing a first object 300 and a second object 310 spaced from the first object 300, wherein an unknown electric potential difference U exists between the first object 300 and the second object 310;

(S20), locating a carbon nanotube composite layer 100 electrically connected to the first object 300 and the second object 310;

(S30), measuring the characteristic band frequency value Y* of Raman-spectra of the carbon nanotube composite layer 100 under the unknown electric potential difference U;

(S40), obtaining a relationship between the characteristic band frequency value Y of Raman-spectra and the electric potential difference $\Delta U$ between the first object 300 and the second object 310; and (S50), obtaining value of unknown electric potential difference U from the relationship.

In the step (S20), the carbon nanotube composite layer 100 is suspended on the first object 300 and the second object 310. The carbon nanotube composite layer 100 includes a first end and a second end electrically connected to the first end. The first end is attached on the first object 300, and the second end is attached on the second object 310. A part of the carbon nanotube composite layer 100 between the first end and the second end is suspended.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A method for measuring electric potential difference, the method comprising:
   providing an object comprising a first region and a second region spaced from the first region, wherein an unknown electric potential difference U exists between the first region and the second region;
   placing a first carbon nanotube composite layer on the object, wherein the first carbon nanotube composite layer is electrically connected to the first region and the second region;
   irradiating the first carbon nanotube composite layer with a Raman-laser to measure a characteristic band frequency value $Y^*$ of Raman-spectra of the first carbon nanotube composite layer under the unknown electric potential difference U; and
   obtaining a value of the unknown electric potential difference U from formula $U=(Y^*-b)/a$, wherein a and b are two constants.

2. The method of claim 1, wherein a part of the first carbon nanotube composite layer between the first region and the second region is spaced from the object.

3. The method of claim 2, wherein the part of the first carbon nanotube composite layer between the first region and the second region is suspended above the object.

4. The method of claim 1, further comprising locating a first electrode on the first region and locating a second electrode on the second region before locating the first carbon nanotube composite layer.

5. The method of claim 4, wherein the first carbon nanotube composite layer is electrically connected to the first electrode and the second electrode and suspended on the object through the first electrode and the second electrode.

6. The method of claim 5, wherein the first carbon nanotube composite layer comprises a first end located on the first electrode, and a second end located on the second electrode.

7. The method of claim 1, wherein the first carbon nanotube composite layer comprises a plurality of carbon nanotubes uniformly dispersed in the first carbon nanotube composite layer, and the plurality of the carbon nanotubes forms a conductive network.

8. The method of claim 1, wherein the first carbon nanotube composite layer comprises a carbon nanotube layer and a metal layer located on the carbon nanotube layer.

9. The method of claim 8, wherein the carbon nanotube layer is a free standing structure, and the metal layer is coated on the carbon nanotube layer.

10. The method of claim 9, wherein the metal layer comprises a plurality of metallic particles coated on a surface of the carbon nanotube layer away from the object.

11. The method of claim 8, wherein the Raman-laser is irradiated on the metal layer, and the carbon nanotube layer is shielded from the Raman-laser by the metal layer.

12. The method of claim 8, wherein a thickness of the metal layer ranges from about 5 nanometers to about 20 nanometers.

13. The method of claim 1, wherein Raman-spectra of the first carbon nanotube composite layer comprises a plurality of peaks, and the characteristic band frequency value $Y^*$ of Raman-spectra of the first carbon nanotube composite layer is obtained from an highest peak G in the plurality of peaks.

14. The method of claim 1, further comprising obtaining a relationship between characteristic band frequency value Y of Raman-spectra and an electric potential difference $\Delta U$ between the first region and the second region of the first carbon nanotube composite layer.

15. The method of claim 14, wherein the relationship between the characteristic band frequency value Y of Raman-spectra and the electric potential difference $\Delta U$ between the first region and the second region comprising following substeps:
   providing a second carbon nanotube composite layer which is same as the first carbon nanotube composite layer;
   locating a third electrode and a fourth electrode electrically connected to the second carbon nanotube composite layer, wherein the third electrode and the fourth electrode are spaced from each other;
   obtaining a plurality of characteristic band frequency values Y' of Raman-spectra of the second carbon nanotube composite layer by applying a plurality of predetermined voltages $\Delta U'$ between the third electrode and the fourth electrode; and
   obtaining the relationship between the characteristic band frequency value Y and the predetermined voltage $\Delta U$ of the second carbon nanotube composite layer by fitting the plurality of characteristic band frequency value Y' and plurality of predetermined voltage $\Delta U'$ of the second carbon nanotube composite layer to a straight line, wherein the relationship between the characteristic band frequency value Y and the predetermined voltage $\Delta U$ of the first carbon nanotube composite layer is same as relationship between the plurality of characteristic band frequency values Y' and the plurality of predetermined voltages $\Delta U'$ of the second carbon nanotube composite layer.

16. The method of claim 15, wherein the relationship between the characteristic band frequency value Y and the predetermined voltage $\Delta U$ of the second carbon nanotube composite layer satisfy $Y=a \cdot \Delta U+b$.

17. A method for measuring electric potential difference comprising:
   providing a first object and a second object spaced from the first object, wherein an unknown electric potential difference U exists between the first object and the second object;
   locating a carbon nanotube composite layer electrically connected to the first object and the second object;
   irradiating the carbon nanotube composite layer with a Raman-laser to obtain a characteristic band frequency value $Y^*$ of Raman-spectra of the carbon nanotube composite layer under the unknown electric potential difference U;
   calculating a value of unknown electric potential difference U from a formula $U=(Y^*-b)/a$, wherein a and b are two constants.

18. The method of claim 17, wherein the carbon nanotube composite layer is suspended by the first object and the second object.

19. A method for measuring electric potential difference comprising:
   locating a carbon nanotube composite layer electrically connected to a first region and a second region spaced from each other;
   getting a characteristic band frequency value $Y^*$ of Raman-spectra of the carbon nanotube composite layer by irradiating the carbon nanotube composite layer via a Raman-laser;

obtaining a relationship between a characteristic band frequency value Y of Raman-spectra and an electric potential difference $\Delta U$ of the carbon nanotube composite layer, wherein the relationship is obtained by:

providing a second carbon nanotube composite layer which is same as the carbon nanotube composite layer;

placing a third electrode and a fourth electrode on the second carbon nanotube composite layer and electrically connected to the second carbon nanotube composite layer, wherein the third electrode and the fourth electrode are spaced from each other;

obtaining a plurality of characteristic band frequency values Y' of Raman-spectra of the second carbon nanotube composite layer by applying a plurality of predetermined voltages $\Delta U'$ between the third electrode and the fourth electrode; and fitting the plurality of characteristic band frequency value Y' and plurality of predetermined voltage $\Delta U'$ of the second carbon nanotube composite layer to a straight line, wherein the relationship between the characteristic band frequency value Y and the predetermined voltage $\Delta U$ of the first carbon nanotube composite layer is same as relationships between the plurality of characteristic band frequency values Y' and the plurality of predetermined voltages $\Delta U'$ of the second carbon nanotube composite layer;

and obtaining a value of an unknown electric potential difference U applied between the first region and the second region by substituting Y* for Y through the relationship between the characteristic band frequency value Y of Raman-spectra and the electric potential difference $\Delta U$.

* * * * *